United States Patent [19]
Yamazaki

[11] Patent Number: 5,489,555
[45] Date of Patent: Feb. 6, 1996

[54] METHOD FOR FORMING A PHOTOELECTRIC CONVERSION DEVICE

[75] Inventor: Shunpei Yamazaki, Tokyo, Japan

[73] Assignee: Semiconductor Energy Laboratory Co., Ltd., Kanagawa, Japan

[21] Appl. No.: 46,841

[22] Filed: Apr. 14, 1993

[30] Foreign Application Priority Data

Apr. 16, 1992 [JP] Japan .................... 4-122595

[51] Int. Cl.⁶ .................................. H01L 21/302
[52] U.S. Cl. ........................... 437/226; 437/2
[58] Field of Search ................ 437/2, 226, 974; 148/DIG. 153, DIG. 12

[56] References Cited

U.S. PATENT DOCUMENTS

| | | | |
|---|---|---|---|
| 4,602,120 | 7/1986 | Wakefield et al. | 437/2 |
| 4,803,375 | 2/1989 | Saito et al. | 437/226 |
| 4,897,141 | 6/1990 | Girard | 437/226 |
| 4,997,793 | 3/1991 | McClurg | 437/226 |
| 5,073,517 | 12/1991 | Iwabuchi et al. | 437/974 |
| 5,240,882 | 8/1993 | Satoh et al. | 437/226 |
| 5,290,367 | 3/1994 | Hayashi et al. | 136/255 |

FOREIGN PATENT DOCUMENTS

| | | | |
|---|---|---|---|
| 54-146955 | 11/1979 | Japan | 437/226 |
| 57-204116 | 12/1982 | Japan | 437/226 |
| 1-293613 | 11/1989 | Japan | 437/226 |

*Primary Examiner*—Olik Chaudhuri
*Assistant Examiner*—S. Mulpuri
*Attorney, Agent, or Firm*—Sixbey, Friedman, Leedom & Ferguson; Gerald J. Ferguson, Jr.

[57] ABSTRACT

A method for forming a photoelectric conversion device, which comprises forming at least one of the constituent elements of the photoelectric conversion device on a photoelectric conversion region having established on either surface or both surfaces of a substrate for forming thereon the photoelectric conversion device, and then separating the substrate into two parts by a plane being incorporated between the two surfaces.

25 Claims, 2 Drawing Sheets

METHOD FOR FORMING A PHOTOELECTRIC CONVERSION DEVICE

BACKGROUND OF THE INVENTION

1. Field of the Invention

The present invention relates to a method for forming a photoelectric conversion device which converts light such as solar light into electric energy, and more particularly, it relates to a method for providing a photoelectric conversion device at good economy.

2. Prior Art

Photoelectric conversion devices using silicon semiconductors have shared the major part of the conventionally known devices, and those based on compound semiconductors such as gallium arsenide have also been put into practice for special uses. The photoelectric conversion devices using silicon semiconductors can be further classified into those using single crystal semiconductors, polycrystalline semiconductors, and amorphous semiconductors such as amorphous silicon. Those silicon based photoelectric conversion devices have each advantages and disadvantages depending on the application fields, and hence they are each used in the field at which their advantages can be fully exhibited.

A photoelectric conversion device based on single crystal semiconductors has a sufficiently high photoelectric conversion efficiency as to provide a large power output. Hence it is promising for use in power generation. However, the material cost and the like are still too high and cost reduction thereof is expected.

A photoelectric conversion device using a polycrystalline semiconductor can be fabricated at a lower material cost as compared with the device based on a single crystal semiconductor, however, it then suffers a lower photoelectric conversion efficiency. Accordingly, it has been desired to further reduce the cost to meet for the low conversion efficiency.

A photoelectric conversion device using an amorphous semiconductor has been developed initially with an aim to lower the fabrication cost of the device. However, no distinct merits with respect to the fabrication cost is found on the device. Moreover, the photoelectric conversion efficiency is as low as half or below. Hence, both the improvement of photoelectric conversion efficiency and the reduction of cost are required to the photoelectric conversion device of this type.

Furthermore, global conservation of resources and protection of environment are required extensively in the industrial field. Accordingly, more attention is paid to photoelectric conversion devices such as solar cells from the viewpoint of saving resources and environmental protection.

However, the solar cell, which is expected to be effective for conserving resources and for environmental protection problems, still consumes much resources due to problems such as low production yield and the use of excessive amount of materials.

SUMMARY OF THE INVENTION

An object of the present invention is to overcome the aforementioned problems of high cost of fabrication and to realize a photoelectric conversion device having a high conversion efficiency by a process effective for conserving resources.

More specifically, the present invention provides a process for fabricating a photoelectric conversion device, which comprises forming a portion for photoelectric conversion on at least one side of a substrate, and then separating the substrate into two parts by a plane incorporated vertical to the thickness direction of the substrate after completing a photoelectric conversion device or forming a photoelectric conversion device properly to thereby use each of the parts individually as a photoelectric conversion device.

A method for forming a photoelectric conversion device in accordance with the present invention comprises the steps of:

forming at least a part of said photoelectric conversion device on at least one of a front surface and a rear surface of a substrate; and cutting said substrate into two pieces in order to separate said front surface and said rear surface from one another after said forming step.

For example, said substrate is cut into two pieces in a direction approximately parallel with said front or rear surface.

DETAILED DESCRIPTION OF THE INVENTION

Figure 1A:
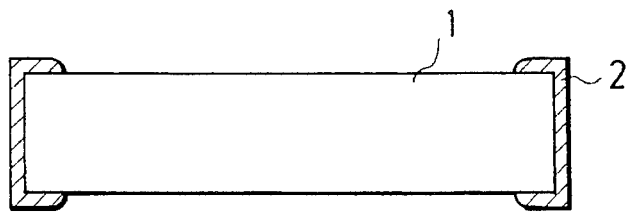
FIGS. 1(A)–1(D) illustrate schematically shown fabrication process for a photoelectric conversion device according to the present invention.

The substrates for use in conventional photoelectric conversion devices include, in general, 2-inch wafers from 0.2 to 0.3 mm in thickness, 4-inch wafers from 0.3 to 0.5 mm in thickness, 5- or 6-inch wafers from 0.4 to 0.6 mm in thickness, and 8-inch wafers from about 0.5 to about 0.7 mm in thickness. A substrate for use in a photoelectric conversion device tends to be thicker with increasing the size thereof. In a photoelectric conversion device, however, a substrate of any size from about 0.15 to about 0.3 mm in thickness suffices the demand. Accordingly, the rest of the wafer, which increases with scaling up the wafer, is wasted as an unnecessary portion. It can be seen that such a process is far from being suitable for conserving the resources.

The process according to the present invention is therefore intended for using efficiently the resources, and is characterized by that it comprises establishing a photoelectric conversion device or a site therefor on both surfaces of a substrate, and then separating the substrate into two by a plane at a certain distance from the surfaces. In a photoelectric conversion device of a structure comprising an electrode drawn out from the back of the substrate, in particular, a favorable substrate of from about 0.2 mm to 0.3 mm in thickness can be realized by reducing the thickness of the initial substrate to about a half.

With respect to the substrate wafers for use in the semiconductor integrated circuits (ICs), a specification of considerably high level is required for the wafers. This leads to the production of a large amount of wafer products which are out of specification. A considerable number of wafer products fail to meet the high specification due to the presence of lattice defects, external flaws, excess amount of impurities, and the like.

In contrast to the above, the wafers for use in photoelectric conversion devices need not satisfy a specification of such a high level as that for use in the semiconductor ICs. Accordingly, there are some cases in which those wafers once rejected for use in the semiconductor ICs meet the required specification for use in photoelectric conversion devices. By using such wafers failing to meet the strict requirements for the semiconductor ICs in fabricating photoelectric conversion devices, the devices can be realized at better economy while conserving resources. For example, a substrate having provided at least a part of a semiconductor integrated circuit on one of a front surface and a rear surface of said substrate is used as a substrate of the photoelectric conversion device in accordance with the present invention.

There are also cases in which a wafer meeting the required specification is used for trial or for establishing the process conditions. A used wafer can be reused by forming a photoelectric conversion region on the other side, and then splitting the wafer into two at a position along the thickness direction of the wafer to complete it into a photoelectric conversion device. In this manner, the resources can be saved while reducing the material cost.

The present invention is described in further detail referring to non-limiting examples. It should be understood, however, that the present invention is not construed as being limited thereto.

EXAMPLE

A photoelectric conversion device according to the present invention was fabricated from a wafer out of specification (an off-specification product as a substrate for use in a semiconductor integrated circuit), which was 6 inch in outer diameter and about 0.55 mm in thickness. The wafer was P-type conductive, and had a resistivity of about 3 Ω.cm.

Referring to FIG. 1, in which the process steps are shown schematically, the process for fabricating a photoelectric conversion device according to the present invention is described below.

As a pretreatment, the surface of a substrate 1 was cleaned to remove impurities therefrom using pure water, acetone, trichloroethane, etc., and an oxide coating was formed on both of the surfaces of the resulting wafer 1 at a temperature of about 1,200° C. for about 30 minutes, by introducing a small amount of trichlene under an oxygen atmosphere by bubbling using nitrogen gas. The oxide coating thus obtained on the wafer was patterned by a known photolithographic process using a predetermined mask to realize a state as shown in FIG. 1(A), in which a peripheral portion 2 is established around the region for photoelectric conversion.

By thus incorporating chlorine during the oxidation process, the alkaline elements such as sodium present in the substrate 1 can be trapped inside the oxide coating. This process imparts high reliability to the photoelectric conversion device.

Figure 1B:
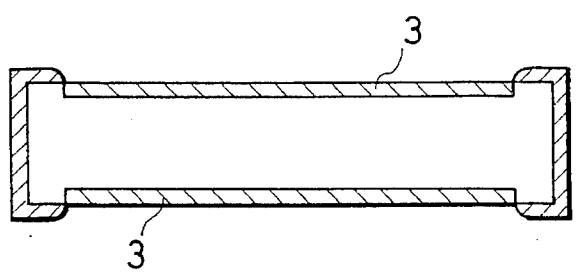

Then, an N-type region 3 was formed on the P-type semiconductor substrate by introducing phosphorus as an impurity into the substrate devoid of the oxide coating. PN junctions can be formed in this manner. The impurity can be introduced into the substrate by, for example, a known ion implantation process, a diffusion process which comprises coating the surface of the substrate with an organic resin or an alcohol solution for silicon oxide coating having mixed therein the impurity, and a plasma doping process. Thus was obtained a structure as shown in FIG. 1(B).

Figure 1C:
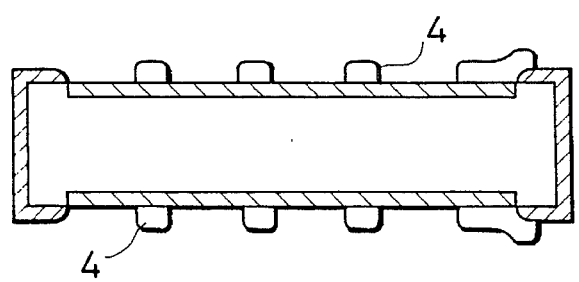

Then, a take off electrode 4 for the light receiving plane was established by applying a metallic paste containing metal particles, e.g., of copper and silver, on the N-type conductive impurity region 3 to give a predetermined pattern by printing process and the like. After printing, the patterned electrode was baked at a low temperature range of from about 150° to about 300° C. for from 10 to 30 minutes to finish the printed pattern into the take off electrode 4. Thus was obtained a structure as shown in FIG. 1(C). The electrode 4 may have a shape selected from the group consisting of grid and circinate shape.

Subsequently, a passivation film 5 which functions as both an antireflection coating and a surface protective coating was deposited on the surface of the resulting structure by a known vapor phase deposition at a thickness of from 500° to 800° C. in the present example, to thereby establish photoelectric conversion devices on both sides of the substrate 1. The film 5 is formed on a front surface portion and a rear surface portion over the electrodes 4 as shown in FIG. 1(D).

Finally, a thick organic resin coating such as of a resist and wax was formed on one side of the resulting substrate to secure surface protection. The substrate thus obtained was mounted on a table in such a manner that the surface on which the organic resin coating had been applied may face the table, and was fixed using a vacuum chuck. Then, the substrate was cut using a wire saw along a plane parallel to the surface of the substrate into two pieces each substantially half the thickness of the original substrate. Thus was obtained two photoelectric conversion devices each being about half the thickness of the original substrate.

Figure 1D:
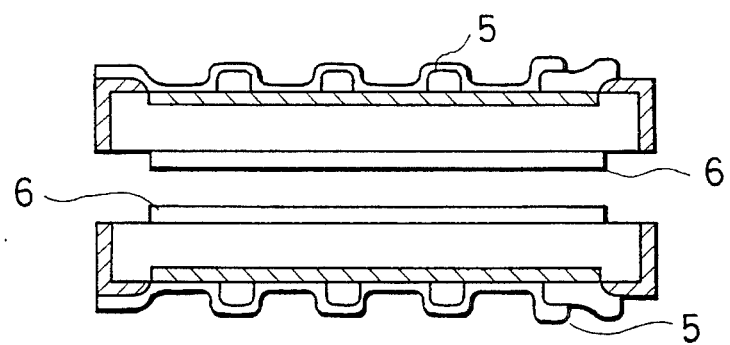

Then, after removing the organic resin having formed on the surface of the photoelectric conversion device, if necessary, an electrode 6 was formed on a cut end of each of said two pieces to finish the structure into a photoelectric conversion device as shown in FIG. 1(D). Thus was obtained a favorable photoelectric conversion device of optimal thickness, i.e., about 0.3 mm in thickness.

Figure 2:
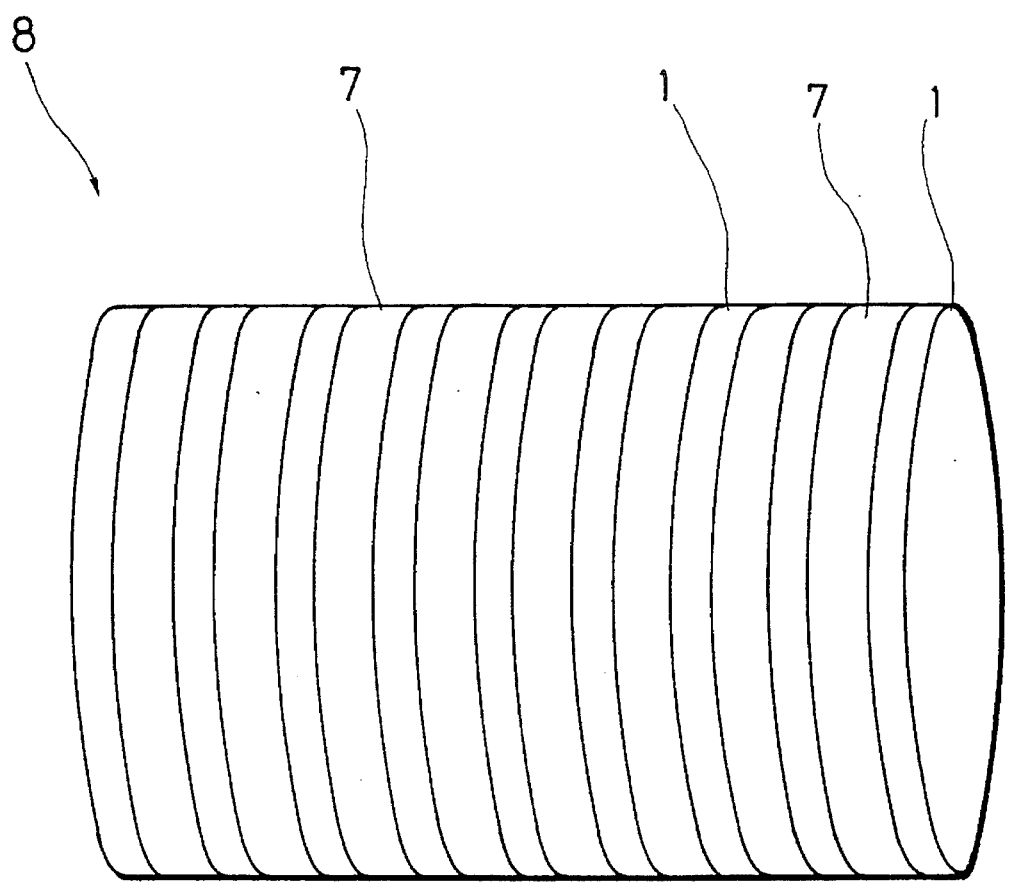
FIG. 2 is a schematically shown structure comprising a cylinder having adhered thereon a plurality of substrates.

In separating the substrate into two pieces in this example, the substrate was fixed to the table using a protective coating. However, the process is not only limited to those mentioned hereinbefore, but the wafer may be adhered to a metallic tube having an outer diameter about the same as that of the wafer, and then the metallic tube may be fixed to separate the wafer. Otherwise, as shown in FIG. 2, the substrates 1 may be adhered together into a cylinder 8 incorporating a plurality of waxed portions therebetween, and after fixing the cylinder 8, each of the substrates i may be separated into two in the same manner as that in cutting out the wafers from silicon ingots. This process is advantageous in that the fixing can be made simply and that the separation of the wafers can be carried out by using an ordinary means. Accordingly, a photoelectric conversion device of better economy can be obtained.

Furthermore, not only cutting using wire saw, but also technologies such as cutting using blades equipped with internal or peripheral cutting edges, electric discharge machining, and laser processing (laser irradiation) may be employed as well.

As described in the above example, a method for forming a photoelectric conversion device in accordance with the present invention comprises the steps of:

forming regions of one conductivity type in a front surface portion and a rear surface portion of a semiconductor substrate of another conductivity type different from said one conductivity type so that junctions of said one conductivity type and said another conductivity type may be formed in said substrate;

forming electrodes on said substrate and in contact with said regions; and cutting said substrate into two pieces in order to separate said front surface portion and said rear surface portion from one another, each having corresponding one of said junctions.

The substrate is cut into two pieces in a direction approximately parallel with a front or rear surface of the substrate.

The photoelectric conversion device described in the foregoing may utilize a violet cell structure by subjecting the resulting device to an additional process step of etching using hydrazine after cleaning the substrate. In this manner, an uneven surface can be produced. By thus intentionally making an uneven surface, the light path can be elongated to thereby use effectively the light incident to the photoelectric conversion device. The conversion efficiency can be greatly improved by taking this cell structure.

As described in the foregoing, the present invention provides a photoelectric conversion device using the resources effectively and at a low cost. The process enables use of substrates which were wasted in the conventional processes as unnecessary or out of specification products. Moreover, the productivity can be increased by forming the photoelectric conversion devices on both surfaces (front and rear surfaces) of one substrate, and thereby the production cost can be further reduced. Two substrates each having provided thereon a photoelectric conversion device can be formed from said one substrate by cutting said one substrate into said two substrates in order to separate a front surface portion and a rear surface portion of said one substrate after the formation of the photoelectric conversion devices. Also, in this case, an n-type region is formed in the p-type substrate in each of the front surface portion and the rear surface portion as a part of the photoelectric conversion device, and an electrode of the photoelectric conversion device is formed on the n-type region, and a protective film is formed on the n-type region over the electrode.

What is claimed is:

1. A method for forming a photoelectric conversion device comprising the steps of:

forming said photoelectric conversion device on or within a front surface and a rear surface of a substrate; and cutting said substrate into two pieces in order to separate said front surface and said rear surface from one another after said forming step.

2. The method of claim 1 wherein said substrate constitutes a substrate for use in a semiconductor integrated circuit.

3. The method of claim 1 wherein said photoelectric conversion device comprises at least a part of a semiconductor integrated circuit formerly formed on said front surface and said rear surface.

4. The method of claim 1 wherein said substrate is cut into two pieces in a direction approximately parallel with said front or rear surface.

5. A method for forming a photoelectric conversion device comprising the steps of:

forming regions of one conductivity type in a front surface portion and a rear surface portion of a semiconductor substrate of another conductivity type different from said one conductivity type so that junctions of said one conductivity type and said another conductivity type may be formed in said substrate;

forming electrodes on said substrate and in contact with said regions; and cutting said substrate into two pieces in order to separate said front surface portion and said rear surface portion from one another, each having corresponding one of said junctions.

6. The method of claim 5 wherein said two pieces have a thickness substantially half of the thickness of said substrate.

7. The method of claim 5 wherein said regions are n-type regions and said substrate is a p-type semiconductor substrate and said junctions are p-n junctions.

8. The method of claim 5 wherein said substrate is cut into two pieces in a direction approximately parallel with a front or rear surface of said substrate.

9. The method of claim 7 wherein the formation of said n-type regions is carried out by introducing an impurity into said substrate by ion implantation or plasma doping.

10. The method of claim 5 further comprising the step of forming a protective film on said front surface portion and said rear surface portion over said electrodes.

11. The method of claim 5 wherein the pattern of said electrodes have a shape selected from the group consisting of grid and circinate shape.

12. The method of claim 10 wherein said protective film functions as an antireflection film.

13. The method of claim 5 wherein the cutting of said substrate is carried out by a wire saw, a blade having an internal or peripheral cutting edge, an electric discharge or a laser irradiation.

14. The method of claim 5 further comprising the step of forming an electrode on a cut end of each of said two pieces.

15. A method for forming a photoelectric conversion device comprising:

forming two substrates each having provided thereon a photoelectric conversion device from one substrate by forming a photoelectric conversion device on each of a front surface portion and a rear surface portion of said one substrate and subsequently cutting said one substrate into said two substrates in order to separate said front surface portion and said rear surface portion.

16. The method of claim 15 wherein said one substrate has a p-type conductivity.

17. The method of claim 16 wherein said two substrates have a thickness substantially half of the thickness of said one substrate.

18. The method of claim 16 wherein an n-type region is formed in the p-type substrate in each of said front surface portion and said rear surface portion as a part of the photoelectric conversion device.

19. The method of claim 18 wherein an electrode of the photoelectric conversion device is formed on said n-type region.

20. The method of claim 19 further comprising the step of forming a protective film on said n-type region over said electrode.

21. The method of claim 1 where said photoelectric conversion device comprises a photovoltaic device.

22. The method of claim 5 where said photoelectric conversion device comprises a photovoltaic device.

23. The method of claim 15 where said photoelectric conversion device comprises a photovoltaic device.

24. The method of claim 1 including forming an electrode on the cut end of each of said two pieces.

25. The method of claim 15 including forming an electrode on the cut end of each of said two pieces.

* * * * *